(12) United States Patent
Murakawa et al.

(10) Patent No.: US 7,374,635 B2
(45) Date of Patent: May 20, 2008

(54) FORMING METHOD AND FORMING SYSTEM FOR INSULATION FILM

(75) Inventors: Shigemi Murakawa, Minato-ku (JP); Toshikazu Kumai, Minato-ku (JP); Toshio Nakanishi, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/636,695

(22) Filed: Dec. 11, 2006

(65) Prior Publication Data

US 2007/0085154 A1 Apr. 19, 2007

Related U.S. Application Data

(62) Division of application No. 10/487,986, filed as application No. PCT/JP02/08735 on Aug. 29, 2002, now Pat. No. 7,166,185.

(30) Foreign Application Priority Data

Aug. 29, 2001 (JP) .............................. 2001-260179

(51) Int. Cl.
*C23F 1/02* (2006.01)
(52) U.S. Cl. ................ 156/345.44; 438/216; 438/261; 438/287; 438/421; 438/591; 438/595; 438/954; 438/981; 438/778; 438/788; 438/792

(58) Field of Classification Search ................ 438/216, 438/261, 287, 421, 591, 595, 954, 981, 778, 438/788, 792; 156/345.44
See application file for complete search history.

(56) References Cited

U.S. PATENT DOCUMENTS

| 6,020,243 A | 2/2000 | Wallace et al. |
| 6,072,221 A | 6/2000 | Hieda |
| 6,158,383 A | 12/2000 | Watanabe et al. |
| 6,399,520 B1 | 6/2002 | Kawakami et al. |
| 2002/0014666 A1 | 2/2002 | Ohmi et al. |

FOREIGN PATENT DOCUMENTS

| JP | 11293470 A | 10/1999 |
| JP | 2000294550 A | 10/2000 |
| JP | 2001-160555 A | 6/2001 |
| WO | WO 00/01008 A1 | 1/2000 |

OTHER PUBLICATIONS

European Search Report dated Oct. 6, 2005 (Three (3) Pages).

*Primary Examiner*—Lynne Gurley
*Assistant Examiner*—Samuel A. Gebremariam
(74) *Attorney, Agent, or Firm*—Crowell & Moring LLP (57) ABSTRACT

A gate insulation film (104) of a MISFET (100) is constituted of a silicon oxide film (106), silicon nitride film (107), and high-permittivity film (108). The silicon oxide film (106) and silicon nitride film (107) are formed by microwave plasma processing with a radial line slot antenna.

9 Claims, 6 Drawing Sheets

FORMING METHOD AND FORMING SYSTEM FOR INSULATION FILM

CROSS-REFERENCE TO RELATED APPLICATIONS

This application is a division of application Ser. No. 10/487,986, filed Feb. 27, 2004, which is the National Phase of International Application PCT/JP02/08735, filed Aug. 29, 2002. This application claims priority from Japanese patent application Ser. No. 2001-260179 filed Aug. 29, 2001, the entire contents of which are expressly incorporated herein by reference.

TECHNICAL FIELD

The present invention relates to a highly reliable forming method and forming system for insulation film.

BACKGROUND ART

With the high-integration and high-miniaturization of semiconductor integrated circuits, the miniaturization of Metal Insulator Semiconductor Field Effect Transistors (MISFET) on the semiconductor integrated circuits is advancing. With the miniaturization, the thickness of a gate insulator is demanded to be extremely thin, being about a couple nanometers.

Generally, silicon oxide ($SiO_2$) film, which is formed by thermal oxidation of a silicon substrate, is applied as a gate insulator. However, thinning a silicon oxide film to a couple nanometers, has problems such as an increase of the gate leakage current (tunnel current), and penetration of impurities from the gate electrode of the MISFET.

To control the increase and so forth of the tunnel current, a stacking gate insulator which has a structure of stacking a higher permittivity film (high-permittivity film) onto a thin-silicon oxide film (or a silicon nitride film, or a silicon oxide-nitride film), is being developed. By applying the stacking gate insulator, physical thickness is secured to a certain extent, and Equivalent Oxide Thickness (EOT) is kept low. Here, the EOT is a converted value of the thickness of the film of the relative permittivity $\epsilon$ and effective film thickness t, to the thickness of the relative permittivity of the silicon oxide film ($\epsilon_{sio_2}/\epsilon$), and is defined as, $EOT=(\epsilon_{sio_2}/\epsilon) \cdot t$.

A forming method of a stacking gate insulator applying a silicon nitride film (SiN film) as a high-permittivity film has been disclosed in the Unexamined Japanese Patent Application KOKAI Publication No. 2000-294550. The insulated gate formed by the method disclosed in the aforementioned publication, comprises a direct silicon oxide-nitride film (or an oxide film or a nitride film) formed in a thickness of one nanometer or less, applying a plasma processing device including a Radial Line Slot Antenna (RLSA), and a SiN film, formed in about 2 nanometers on this oxide-nitride film by CVD.

When an RLSA-type plasma processing device is applied, a more high-quality film with less dangling bond is formed, compared to being formed by a CVD. Also, because the film forming processing, applying the RLSA plasma processing, is conducted in a relatively low temperature (250°~450°), the damage of the film surface is decreased compared to other plasma processing. In this way, films formed by applying the RSLA-type plasma processing is high in quality, therefore annealing in a high temperature, at about 1000°, is not necessary, and diffusion of dopant can be prevented.

Here, the aforementioned stacking gate insulator applies the SiN film as the high-permittivity film. The relative permittivity of the SiN film is about 8, therefore the EOT of the SiN film is only about 0.5 (=4/8) times the effective film thickness. Due to this, when the SiN film is applied, there is a limit to securing a sufficiently thick physical film thickness, and gaining a sufficiently thin EOT by answering to the demand of miniaturization.

By this, when inorganic insulation films with higher relative permittivity, for example, aluminum oxide (relative permittivity:11), zirconium oxide (24), and hafnium oxide (25) are applied, an EOT about 0.17 (=4/24) times the effective film thickness can be gained.

As aforementioned, by applying an inorganic high-permittivity film, a requested gate insulator having the requested permittivity can be gained. However, if an organic high-permittivity film is directly formed onto the silicon oxide film, the silicon oxide film and the organic film will cause a reaction. By this, the EOT of the whole stacking gate insulator will increase.

Generally, the aforementioned inorganic high-permittivity films are formed, for example, by applying an organic metal such as ethoxide metal as the precursor, by CVD. By this, the formed high-permittivity film includes a few percent of carbon. When the carbon content is high, reliability declines, such as the occurrence of the leakage current increasing.

In this way, hitherto, it was difficult to generate a highly reliable gate insulator having a sufficient physical thickness and a sufficiently thin EOT.

DISCLOSURE OF THE INVENTION

The object of the present invention is to provide a forming method and forming system for insulation film, in which a highly reliable insulation film can be produced.

To achieve the object, the forming method according to a first aspect of the present invention comprises; a silicon oxide film forming process for forming a silicon oxide film on the surface region of a silicon substrate; a silicon nitride film forming process for forming a silicon nitride film on the surface region of the aforementioned silicon oxide film; and a forming process for forming a permittivity film with a higher permittivity than the silicon oxide film on the aforementioned silicon nitride film, wherein: the aforementioned oxide film forming process comprises a forming method for forming the silicon oxide film on the surface region of the aforementioned silicon substrate by subjecting the surface of said silicon substrate to a plasma, generated by irradiating microwave from a plane antenna having plural slits, to an oxygen containing gas; and the aforementioned nitride film forming process comprises a forming method for forming the silicon nitride film on the surface region of the aforementioned silicon oxide film by subjecting the surface of the aforementioned silicon oxide film to a plasma, generated by irradiating microwave from a plane antenna having plural slits, to a nitride containing gas.

It is preferable that the aforementioned oxide film forming process includes a process for reforming the oxide film already existing on the aforementioned silicon substrate, by subjecting the surface of the aforementioned silicon substrate to a plasma, generated by irradiating microwave, from a plane antenna having plural slits, to an oxygen containing gas.

It is preferable that the aforementioned oxide film forming process comprises a process for exposing the surface of the aforementioned silicon substrate, and a process for oxidizing the surface region of the aforementioned silicon substrate, by subjecting the exposed surface of said silicon substrate to a plasma, generated by irradiating microwave from a plane antenna having plural slits, to an oxygen containing gas.

It is preferable that the aforementioned nitride film forming process comprises a process for nitriding the surface region of the aforementioned silicon oxide film, by subjecting the surface of the aforementioned silicon oxide film to a plasma, generated by irradiating microwave from a plane antenna having plural slits, to a nitrogen containing gas.

The aforementioned permittivity film is comprised of metal as the main component, and may further comprise a permittivity film reforming process, for reforming the aforementioned permittivity film by subjecting the surface of the permittivity film to a plasma, generated by irradiating microwave from a plane antenna having plural slits, to an oxygen containing gas.

In the aforementioned oxide film forming process, the silicon oxide film is formed at a thickness of 1 nm~20 nm, and in the nitride film forming process, the nitride film is formed at a thickness of 0.5 nm~6 nm.

It is preferable that the aforementioned gas comprises argon.

The aforementioned insulation film comprises a gate insulator of a MISFET.

To achieve the aforementioned object, a forming system of an insulation film according to the second aspect of the present invention comprises: an oxide film forming unit for forming a silicon oxide film on the surface region of a silicon substrate; a nitride film forming unit for forming a silicon nitride film on the surface region of the silicon oxide film; and a permittivity film forming unit for forming a permittivity film of a higher relative permittivity, than the silicon oxide film, on the aforementioned silicon nitride film; wherein: the oxide film forming unit forms a silicon oxide film on the surface region of the silicon substrate, by exposing the surface of the silicon substrate to a plasma, generated by irradiating microwave from a plane antenna having plural slits, to an oxygen containing gas; and the nitride film forming unit forms a silicon nitride film on the surface region of the silicon oxide film, by exposing the surface of the silicon oxide film to a plasma, generated by irradiating microwave from a plane antenna having plural slits, to a nitrogen containing gas.

It is preferable that the oxide film forming unit reforms the oxide film, already existing on the silicon substrate, by exposing the surface of the silicon substrate to a plasma, generated by irradiating microwave from a plane antenna having plural slits, to an oxygen containing gas.

It is preferable that the oxide film forming unit exposes the surface of the silicon substrate, and the oxide film forming unit oxides the surface region of the silicon substrate by exposing the surface of the silicon substrate to a plasma, generated by irradiating microwave from a plane antenna having plural slits.

It is preferable that the nitride film forming unit nitrides the surface region of the silicon oxide film by exposing the surface of the silicon oxide film to a plasma, generated by irradiating microwave from a plane antenna having plural slits to nitride containing gas.

The permittivity film is comprised of metal as the main component, and may further comprise a permittivity film reforming unit for reforming the permittivity film, by exposing the surface of the permittivity film to a plasma, generated by irradiating microwave from a plane antenna having plural slits.

The oxide film forming unit forms the silicon oxide film of a thickness of 1 nm to 20 nm, and the nitride film forming unit forms the nitride film of a thickness of 0.5 nm to 6 nm.

It is preferable that the aforementioned gas comprises argon.

The aforementioned insulation film comprises a gate insulator of a MISFET.

BRIEF DESCRIPTION OF DRAWINGS

These objects and other objects and advantages of the present invention will become more apparent upon reading of the following detailed description and the accompanying drawings in which.

BEST MODE FOR CARRYING OUT THE INVENTION

The forming method of the insulation film according to the embodiment of the present invention will be described referring to the drawings.

Figure 1:
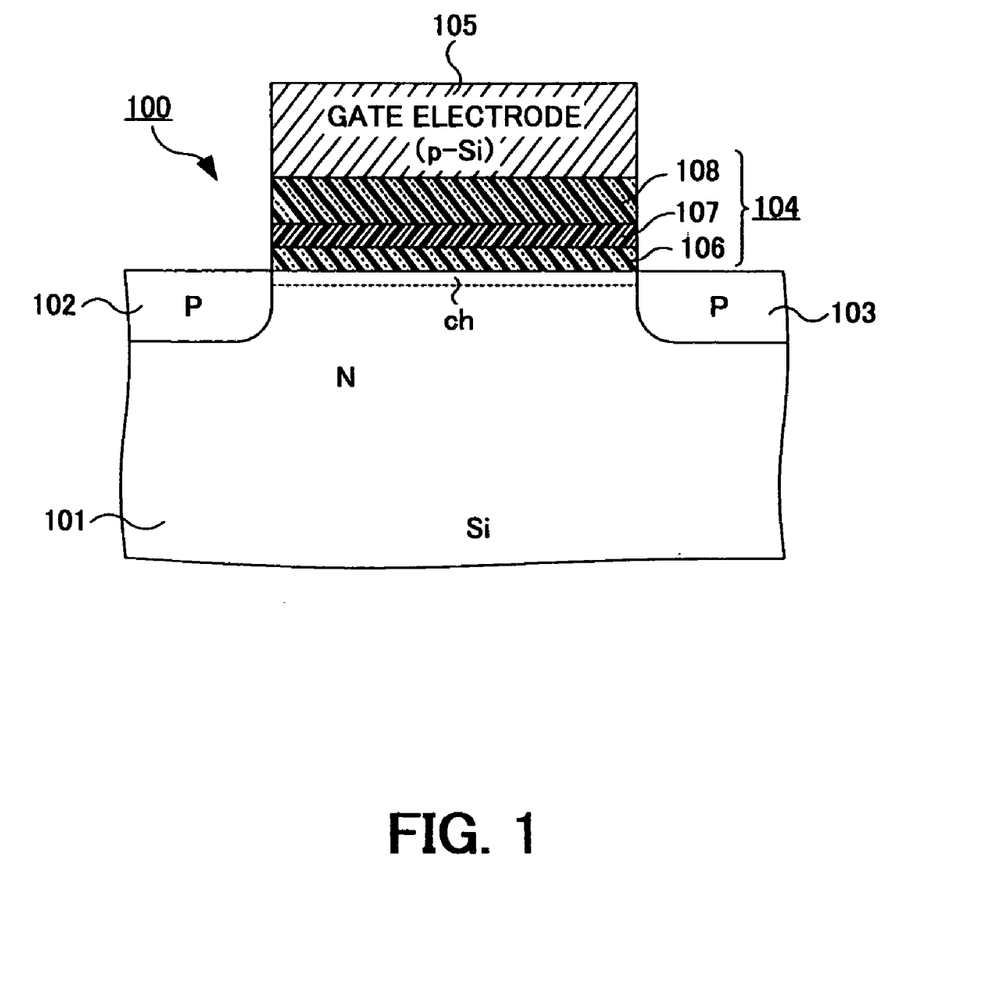
FIG. 1 is a diagram showing the structure of a gate insulator, according to the embodiment of the present invention.

The insulation film, formed according to the embodiment of the present invention, comprises a gate insulator of a Metal Insulator Semiconductor Field Effect Transistor (MISFET) shown in FIG. 1.

As shown in FIG. 1, MISFET 100 comprises, a P-type drain region 102 and source region 103 in the surface region of an N-type silicon substrate 101, a gate insulator 104 formed on the surface region (channel region) of the silicon substrate 101, which is placed between the P-type drain region 102 and source region 103, and a gate electrode 105 formed on the gate insulator 104. Drain region 102 and source region 103, are respectively connected to a drain electrode and source electrode, comprising a MISFET 100. Silicon substrate 101, drain region 102 and source region 103, respectively may be opposite conductivity types.

On the silicon substrate 101, placed between the drain region 102 and source region 103, the gate electrode 105 is provided via the gate insulator 104. The gate electrode 105 is comprised of polycrystalline silicon (p-Si). The gate electrode 105 comprises the MISFET 100, and when the gate threshold voltage is applied to the gate electrode 105, a channel (ch) is formed on the surface of the silicon substrate 101 under the gate insulator 104, and the source and the drain are connected.

The gate insulator 104 is comprised of a silicon oxide film ($SiO_2$ film) 106, a silicon nitride film (SiN film) 107, and a high-permittivity film 108.

The silicon oxide film 106 is formed on the surface region (channel ch) of the silicon substrate 101. The silicon oxide film 106 is formed by the oxidation processing of the surface region of the silicon substrate 101, wherein a plasma processing device having a Radial Line Slot Antenna (RLSA) is applied. The silicon oxide film 106 is, for example, formed in a thickness of 0.5 nm to 14 nm.

The silicon nitride film 107 is stacked on the silicon oxide film 106. The silicon nitride film 107 is formed by the nitriding processing of the silicon oxide film 106 applying the RLSA type plasma processing device. The silicon nitride film 107 is, for example, formed in a thickness of 0.5 nm to 6 nm.

The high-permittivity film 108 is placed between the silicon nitride film 107 and the gate electrode 105. The high-permittivity film 108 is comprised of inorganic (metal) materials, such as $Al_2O_3$, $HfSiO_2$, $Ta_2O_5$, $ZrSiO_2$, $HfO_2$, and $ZrO_2$. The high-permittivity film 108 is formed, for example in a thickness of 1 nm to 20 nm by CVD (Chemical Vapor Deposition). Here, the high-permittivity film stands for a film having a higher dielectric constant than that of the silicon oxide film (about 4).

Next, the forming method of the above-mentioned gate insulator 104 will be described referring to the drawings.

Figure 2:
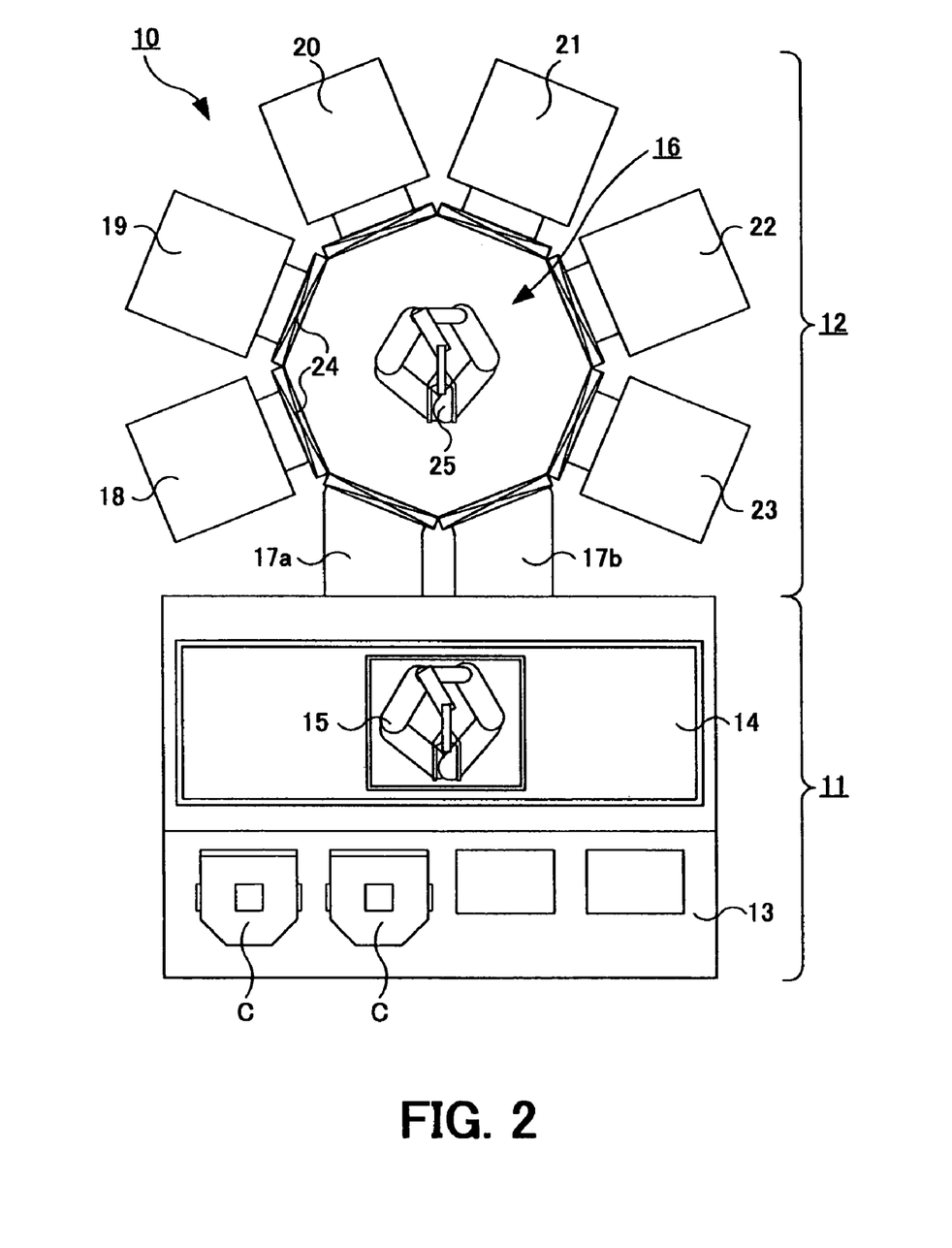
FIG. 2 is a diagram showing the structure of a forming system of the gate insulator, according to the embodiment of the present invention.

FIG. 2 shows the composition of a forming system 10 of a gate insulator according to the embodiment of the present invention. As shown in FIG. 2, the forming system 10 of the gate insulator comprises a cassette station 11, and a processing station 12.

The cassette station 11 includes a cassette mounting table 13, and a first conveyance room 14. On the cassette mounting table 13, a cassette C wherein a predetermined number of wafers can be accommodated, is placed. While a cassette C, accommodating un-processed wafers, is mounted in the cassette mounting table 13, a cassette C, accommodating processed wafers, is transferred out from the mounting table 13.

A first conveyance system 15, having an arm, is placed in the first conveyance room 14. The first conveyance system 15 transfers in the accommodated wafer in a cassette C to the side of the processing station 12, while it transfers out the processed wafer from the side of the processing station 12, and accommodates it to a cassette C. The interior of the first conveyance room 14 is kept clean by the down flow of clean air.

The processing station 12 comprises a second conveyance room 16, a load lock unit 17*a*, and 17*b*, an etching unit 18, an oxidation processing unit 19, a nitriding processing unit 20, a CVD unit 21, an annealing unit 22, and a spare unit 23.

Each unit is connected to the circumference of the almost octagonal-shaped second conveyance room 16 through a gate valve 24. Namely, the processing station 12 comprises a clustered-type system. The second conveyance room 16 includes an exhaust system, etc. and can decompress. Each unit 17 through 23, being isolated by the gate valve 24, comprises an exhaust system, and an independent atmosphere from the second conveyance room 16 may be formed in the interior.

In the center of the second conveyance room, a second conveyance system 25 is placed. The second conveyance system 25 comprises an arm, and transfers the wafer among each unit 17 through 23.

The load lock unit 17*a*, and 17*b* are connected to the first conveyance room 14 in the cassette station 11. The load lock unit 17*a*, functions as a wafer transferring-in port to the processing station 12, and the load lock unit 17*b*, functions as a wafer transferring-out port. The first conveyance system 15 transfers the wafer, accommodated in the cassette C of the cassette mounting table 13, into the load lock unit 17*a*.

The first conveyance system 15 also transfers out the processed wafer from the load lock unit 17*b*, and accommodates it in cassette C.

Figure 3:
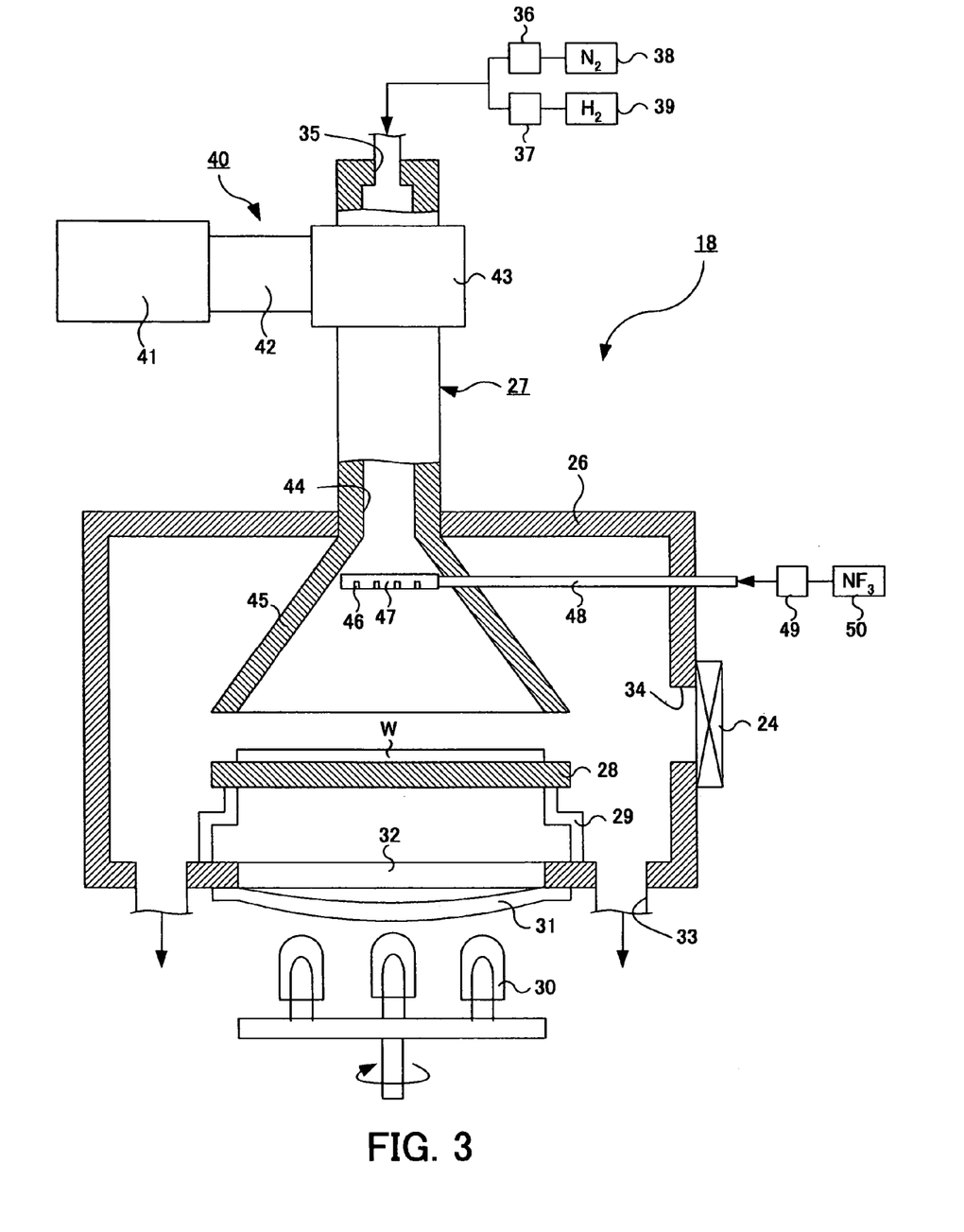
FIG. 3 is a diagram showing the structure of an etching unit, according to the embodiment of the present invention.

The etching unit 18 eliminates the native oxide film (silicon oxide film), which is formed on the surface of the wafer (hereinafter wafer W). FIG. 3 is a sectional view showing a structure of the etching unit 18.

As shown in FIG. 3, the etching unit 18 comprises a chamber 26, and a plasma forming tube 27.

The chamber 26 is comprised of aluminum, etc. and is formed in an almost cylindrical shape. In the interior of the chamber 26, a mounting table 28 for placing wafer W is provided. The mounting table 28 is supported, for example, by a quartz-made prop installed on the base of the chamber 26.

Downwards of the chamber 26, heating lamps 30, such as halogen lamps, are placed to heat the mounting table 28 and the interior of the chamber 26 to a predetermined temperature. A transmission window 31 made of a material such as quartz, is placed between the chamber 26 and the heating lamps 30. On the bottom of the chamber 26, an irradiation opening 32 is formed, and the ends of the transmission window 31 are bonded airtight to the circumference of the irradiation opening 32. By this, the heat waves emitted from the heating lamps 30, irradiate the interior of the chamber 26 (the opposite side of the mounting table 28) going through the transmission window 31 and irradiation opening 32.

In the circumference of the prop 29 at the bottom of the chamber 26, an exhaust opening 33 is provided. The exhaust opening 33 is connected to an exhaust line having a vacuum pump, etc. The interior of the chamber 26 is set at a predetermined pressure by the exhaust line.

On the side wall of the chamber 26, a transferring inlet/outlet 34 is provided at approximately the same height as the mounting table 28. The transferring inlet/outlet 34 is connected to the second conveyance room 16, through the gate valve 24. When the gate valve 24 is open, the transferring in/out of the wafer W is carried out, through transferring inlet/outlet 34.

The plasma forming tube 27 is comprised of a material such as quartz, and is structured in a tube-shape. The plasma forming tube 27 is assembled, piercing through the ceiling of chamber 26. On the upper end of the plasma forming tube 27, a gas feed port 35 is provided, and this gas feed port 35 is connected to a nitrogen gas source 38 and hydrogen gas source 39 through mass flow controllers 36 and 37. By this, a mixed gas of nitrogen ($N_2$) and hydrogen ($H_2$) is supplied into the plasma forming tube 27 through the gas feed port 35. Here, the mixed gas is for example supplied at nitrogen/hydrogen=100 sccm/10 sccm.

On the upper part of the plasma forming tube 27, a plasma forming unit 40 is provided. The plasma forming unit 40 comprises a microwave generating source 41, a rectangular waveguide tube 42, and an Evenson-type waveguide tube 43.

The microwave generating source 41 generates a microwave having a wavelength of, for example, 2.45 GHz. The microwave generated from the microwave generating source 41 is supplied into the plasma forming tube 27, through rectangular waveguide tube 42 and Evenson-type waveguide tube 43. The mixed gas of nitrogen and hydrogen, supplied through the gas feed port 35, is supplied into the interior of the plasma forming tube 27, and supplied microwave activates the mixed gas. By this, a down flow of gas plasma is occurred from the upper part to the lower part of the plasma forming tube 27.

In the lower end of the plasma forming tube 27, an outlet 44 is provided. A casing material 45 which communicates with the outlet 44 and spreads downwards in an umbrella-shape or cone-shape, is provided in the outlet 44. By the casing material 45, the gas flowing out of the outlet 44 is diffused and provided to the chamber 26.

Directly below the outlet 44, a ring-shaped showerhead 47, comprising many gas holes 46, is placed. The showerhead 47 is connected to the nitrogen trifluoride ($NF_3$) gas source 50 through a communicating tube 48 which pierces through the wall of the chamber 26, and a mass flow controller 49 equipped with the communicating tube 48.

$NF_3$ gas is provided from the showerhead 47, and the $NF_3$ gas is provided during the down flow of a mixed gas plasma made of hydrogen and nitrogen. Here, $NF_3$ is for example provided at 30 sccm. In the plasma, hydrogen and nitrogen are in an active state such as a radical, and $NF_3$ molecules are activated by the collision with these radicals and generates radicals such as a fluorine radical by dissociation. The gas provided on the wafer W is in a plasma state, including gas such as nitrogen radical, hydrogen radical, and fluorine radical, etc.

When the plasma, formed in the aforementioned way, contacts the surface of the wafer W, a film including Si, N, H, F and O (it has not been specifically clarified) is formed on the surface of the wafer W. This film easily sublimes when the wafer W is heated to a temperature higher than 100° C., and is eliminated from the surface of the wafer W. In the above-mentioned way, the native oxide film ($SiO_2$ film) on the surface of the wafer W, is eliminated by the down flow of the plasma.

On the surface of the silicon substrate which the native oxide film ($SiO_2$ film) is eliminated, many silicon dangling bonds exist, but these bond with the hydrogen (radical) in the plasma. By this, the surface of the substrate is stabilized.

Figure 4:
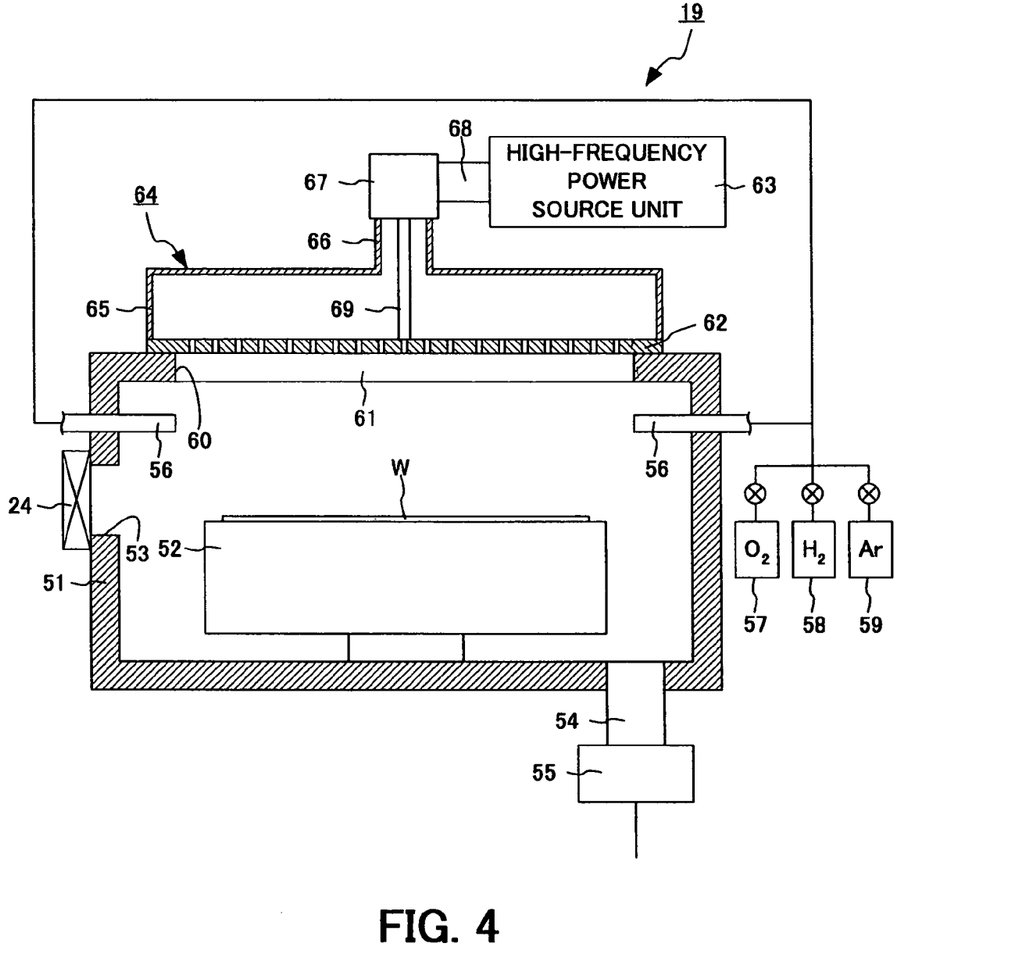
FIG. 4 is a diagram showing the structure of an oxidation processing unit, according to the embodiment of the present invention.

The oxidation processing unit 19 is an RLSA (Radial Line Slot Antenna)-type processing device. The oxidation processing unit 19 generates the plasma of the processing gas by using microwave energy, and by this plasma, oxidizes the surface of a silicon substrate 101, and forms a silicon oxide film 106.

The section structure of the oxidation processing unit 19 is shown in FIG. 4. As shown in FIG. 4, the oxidation processing unit 19 comprises an almost cylindrical chamber 51. The chamber 51 is comprised of aluminum, etc.

In the center of the chamber 51, a mounting table 52 of the semiconductor wafer (hereinafter wafer W), which is subjected to processing, is placed. In the mounting table 52, a temperature control unit, which is not shown in the diagrams, is embedded, and by the temperature control unit, wafer W is heated to a predetermined temperature, for example, from room temperature to 600° C.

On the side wall of the chamber 51, a transferring inlet/outlet 53 is provided at approximately the same height as the top surface of the mounting table 52. The transferring inlet/outlet 53 is connected to the second conveyance room 16 through gate valve 24. When the gate valve 24 is open, the transferring in/out of wafers W is carried out through the transferring inlet/outlet 53.

One end of an exhaust tube 54 is connected to the bottom of the chamber 51, and the other end is connected to an exhaust system 55 such as a vacuum pump. The interior of the chamber 51 is set at a predetermined pressure by the exhaust system 55, etc. for example at a pressure from 4.0 Pa to 0.13 kPa (30 mTorr to 1 Torr).

Gas supply tubes 56 are placed in the upper side of the chamber 51. The gas supply tubes 56 are connected to an Oxygen ($O_3$) gas source 57, a Hydrogen ($H_2$) gas source 58, and Argon (Ar) gas source 59. The gas supply tubes 56 are placed uniformly, for example in 16 places, along the side wall of the chamber 51, in a circle direction. By being placed this way, the gas provided by the gas supply tubes 56, is provided equally to the upward of the wafer W on the mounting table 52.

An aperture 60 is provided on the upper side of the chamber 51. A window 61 is provided in the interior of the aperture 60. The window 61 comprises transmission material, for example quartz, and $SiO_2$ glass, inorganic material such as $Si_3N_4$, NaCl, KCl, LiF, $CaF_2$, $BaF_2$, $Al_2O_3$, AlN, MgO, and films or sheets of organic material such as polyethylene, polyester, polycarbonate, cellulose acetate, polypropylene, polyvinylchloride, polyvinylidenechloride, polystyrene, polyamide, and polyimide.

For example, a Radial Line Slot Antenna 62 (hereinafter RLSA) is provided on top of the window 61. On top of the RLSA 62, a waveguide 64 connected to a high-frequency power source unit 63, is provided. Waveguide 64 comprises, a flat circular waveguide tube 65 wherein the bottom end is connected to the RLSA 62, a cylindrical waveguide tube 66 wherein one end is connected to the top surface of the circular waveguide tube 65, a coaxial waveguide converter 67 which is connected to the top surface of the cylindrical waveguide tube 66, and a rectangular waveguide tube 68 wherein one end is connected in a right angle to the side of the coaxial waveguide converter 67, and the other end is connected to the high-frequency power source unit 63. RLSA 62 and waveguide 64 are comprised of copper plates.

In the interior of the cylindrical waveguide tube 66, a coaxial wave guide tube 69 is placed. The coaxial wave guide tube 69 is comprised of an axis member made of electrically conductive material, and one end of the tube is connected to nearly the center of the top surface of the RLSA 62, and the other end thereof is connected coaxially to the top surface of the cylindrical wave guide tube 66.

Figure 5:
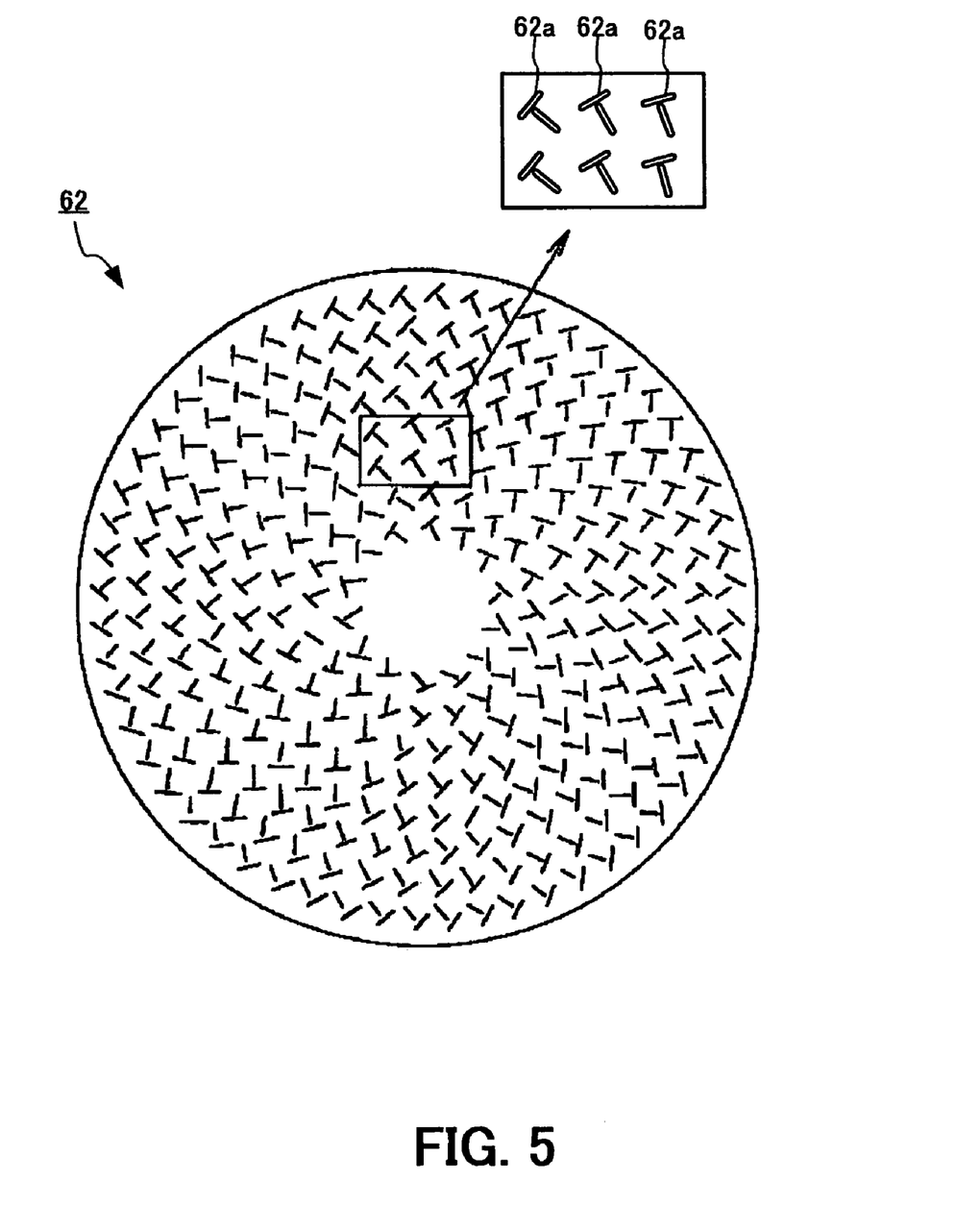
FIG. 5 is a top view of a RLSA, according to the embodiment of the present invention.

FIG. 5 shows a plan view of RLSA 62. As shown in FIG. 5, RLSA 62 comprises plural slots 62a, 62a, ..., which are provided on the same circle, on the surface. Each slot 62a is an almost rectangle perforated trench, and the adjacent slots 62a are placed so that they are at a right angle with each other and form an almost letter of T. The length and placement interval of the slot 62a is determined, according to the wavelength of the high-frequency wave generating from the high-frequency power source unit 63.

The high-frequency power source unit 63 generates a microwave of for example 2.45 GHz at a power of for example 500 to 5 kW. The microwave generated from the high-frequency power source unit 63, is transferred to the interior of the rectangular waveguide tube 68 at a rectangular mode. Furthermore, the microwave is transformed from the rectangular mode to a circular mode in the coaxial waveguide converter 67, and is transferred to the cylindrical waveguide tube 66 at the circular mode. The microwave is further transferred in a spread state by the circular waveguide tube 65, and is irradiated from the slot 62a of the RLSA 62. The irradiated microwave transmits the window 61, and is infused into the chamber 51.

The interior of the chamber 51 is set at a predetermined vacuum pressure, and mixed gas of Ar, $O_2$, and $H_2$ is supplied to the interior of the chamber 51, for example at $Ar/O_2/H_2=10:1:1$, from the gas supply tube 56. By the microwave transmitting the window 61, high-frequency wave energy is conveyed to the mixed gas in the interior of the chamber 51, and high-frequency plasma is generated. At this time, because the microwave is irradiated from the many slots 62a of the RLSA 62, a high-density plasma is generated. Here, activated species in the plasma formed by using the RLSA 62, has an electron temperature of about 0.7 to 2 eV. In this way, according to the RLSA 62, plasma-activated species which activate relatively placidly is formed.

By an exposure to the generated high-density plasma, an oxidation of the wafer W surface is carried out. Namely, the Ar radical in the generated plasma, provides energy by acting to the silicon substrate of the wafer W surface, and cuts the Si bonding with each other. Furthermore, oxygen (O) radical forms a Si—O bonding with Si. In this way, the surface of the silicon substrate is oxidized, and a silicon oxide film of, for example 1 nm to 20 nm, is formed.

At this time, an H radical which generates from $H_2$ bonds with the Si dangling bond, and stabilizes the formed silicon oxide film and improves the film quality.

The nitriding processing unit 20 is the same RLSA-type plasma processing device as the oxidation processing unit 19. The nitriding processing unit 20 forms a silicon nitride film 107 by nitriding a part of the surface of the silicon oxide film 106, formed in the oxidation processing unit 19.

The nitriding processing unit 20 has almost the same structure as the oxidation processing unit 19 shown in FIG. 3. What differs from the oxidation processing unit 19 is that nitrogen ($N_2$) gas is applied instead of oxygen ($O_2$) gas. In the nitriding processing, a mixed gas of Ar, $N_2$, and $H_2$ is applied at the ratio of, for example, $Ar/N_2/H_2=10:1:1$.

The gas applied instead of oxygen may be any gas including nitrogen such as $NH_3$, $N_2O$, $NO$, and $NO_2$.

The silicon oxide film ($SiO_2$ film) formed on the surface of the wafer W by the plasma processing of the nitride processing 20, according to the action of the activated Ar radical, the Si—O bonding is cut. Furthermore, by the nitrogen (N) radical, generated from a gas containing nitrogen, bonding with this dissociated Si, a Si—N bond is generated. In this way, a part of the surface of the silicon oxide film is nitrided, and a silicon nitride (SiN) film 107 of 0.5 nm to 6 nm is formed.

Figure 6:
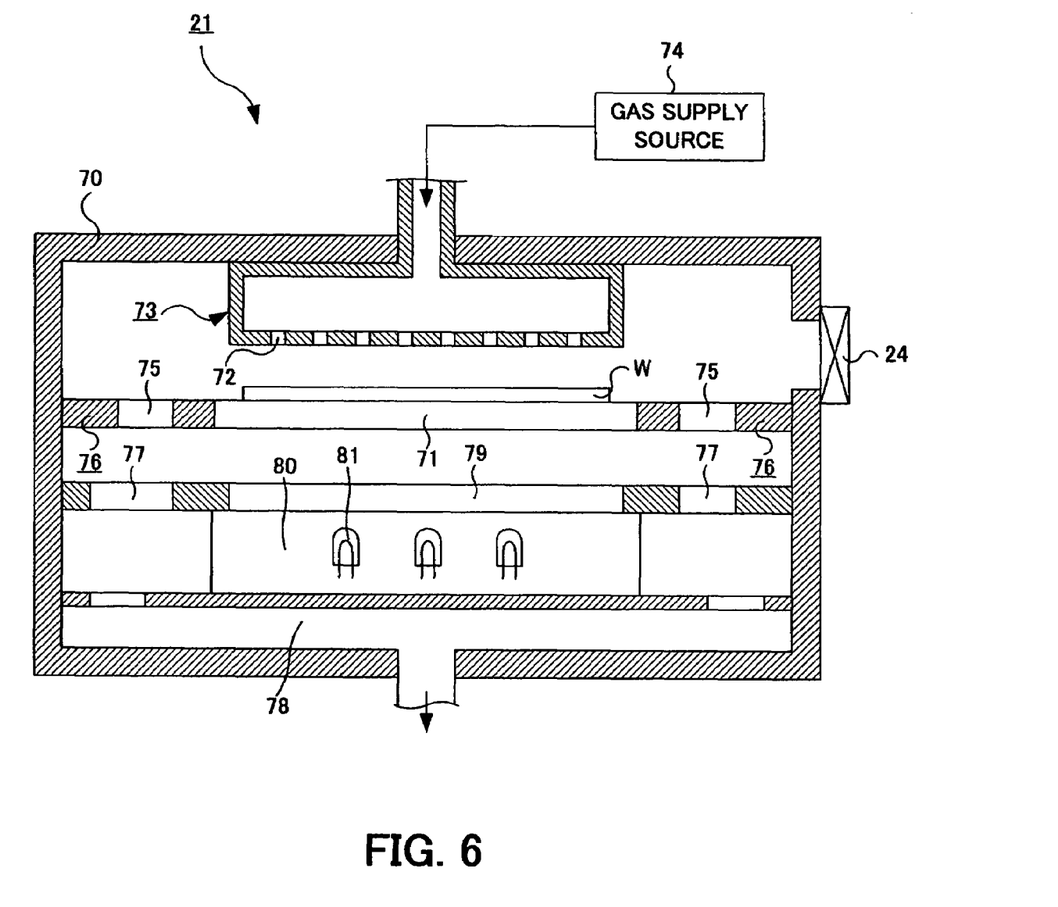
FIG. 6 is a diagram showing the structure of a CVD unit, according to the embodiment of the present invention.

The CVD unit 21 forms a high-permittivity film 108, here a tantalum oxide ($Ta_2O_5$) film, on the surface of the wafer W, wherein the nitride processing is carried out, and the SiN film 107 is formed. FIG. 6 shows a plan structure of the CVD unit 21.

As shown in FIG. 6, the CVD unit 21 comprises an almost cylindrical chamber 70. The chamber 70 is for example comprised of aluminum. In the center of the interior of the chamber 70, a susceptor 71 for conserving the wafer W, is provided.

On the upper part of the chamber 70, a showerhead 73 having plural gas supply holes 72, is provided so that it opposes the susceptor 71. A processing gas supply line is connected to the showerhead 73. A processing gas source 74 is connected to the processing gas supply line.

In this example where a $Ta_2O_5$ film is being formed, the processing gas comprises, for example, organic tantalum gas which is heat-vaporized to 100° C. to 200° C., for example, penta-ethoxy-tantalum gas ($Ta(OC_2H_5)_5$) and nitrogen gas which includes oxidizing gas and moisture, and inactive gas as a carrier gas, for example argon gas. These processing gas are bonded just before or in advance, and supplied into the shower head 73, and is supplied to the whole surface of the wafer W through the gas supply holes 72.

In the circumference of the susceptor 71, a baffle plate 76 having plural baffle holes 75 is arranged. The gas supplied from the showerhead 73 to the interior of the chamber 70, flows downward through the baffle hole 75. In the bottom part of the chamber 70, plural exhaust ports 77 are provided.

The exhaust ports 77 are connected to the buffer tank 78. By the buffer tank 78, the gas supplied to the interior of the chamber 70 is once stored, and by this, a uniformity in pressure in the chamber 70 can be gained.

Furthermore, the buffer tank 78 is connected to the exhaust line. The exhaust line connects to a vacuum pump etc., and sets a predetermined pressure in the interior of the chamber 70, for example at 0.13 kPa (1 Torr).

Down below the susceptor 71, a heating room 80, made of quartz etc., through window 79, is placed. In the heating room 80, plural heating lamps 81 such as the halogen lamps are provided. By the heating of the heating lamps 81, through window 79, the susceptor 71 (and the interior of the chamber 70) is set at a predetermined temperature, for example at 300° C. to 600° C.

On the side wall of the chamber 70, a transferring inlet/outlet 82 is provided at approximately the same height as the susceptor 71. The transferring inlet/outlet 82 is connected to the second conveyance room 16 through the gate valve 24. When the gate valve 24 is open, the transferring in/out of the wafer W is carried out by the second conveyance system 25.

In the aforementioned structure of the CVD unit 21, CVD processing is carried out for example for ten minutes, and for example a high-permittivity film ($Ta_2O_5$ film) 108 of 1 nm to 20 nm is formed on the SiN film 107 formed by the nitride processing.

The annealing unit 22 has almost the same structure as the oxidation processing unit. The annealing (reforming) of the high-permittivity film (metallic insulation film) 108, wherein the film is formed by the CVD unit 21, is carried out in the annealing unit 22. Namely, a precursor (ethoxide metal) originated carbon (C), included in the metallic insulation film 108, and oxygen plasma reacts, and eliminates as for example CO and $CO_2$. By this, a high-quality high-permittivity film 108 wherein the carbon content is low, and the gate leakage current etc., is decreased, can be gained.

Moreover, the processing gas applied in the annealing unit 22, may be different from the gas mixture ratio of the oxidation processing unit 19, such as by reducing the oxygen gas ratio.

The spare unit 23 is a multi-purpose unit that is applicable as another processing unit, for example, as a heating processing unit. To improve the throughput of the whole forming system 10 of the gate insulator, each above-mentioned unit 17 to 22 may be provided.

Furthermore, the number of spare units 23 is not limited to one, and plural units may be provided.

The forming method of a gate insulator 104 applying the above-mentioned structure of the forming system 10 of the gate insulator 104 will be described below, referring to FIG. 2.

First, wafers W each having a formed drain region 102 and a source region 103, are prepared. These wafers W, are accommodated into the cassette C in predetermined numbers, for example every 25, and mounted on the cassette mounting table 13 of the cassette station 11.

The first conveyance system 15 takes out the wafer W from the interior of the cassette C, and mounts it inside the load lock unit 17a. Then, the load lock unit 17a is closed, and almost the same pressure is set as the second conveyance room 16. After that, the gate valve 24 is opened, and the second conveyance system 25 takes out the wafer W from the load lock unit 17a.

The second conveyance unit 25 transfers in the wafer W to the etching unit 18, and mounts it on the mounting table 28. Then, the gate valve 24 is closed, and the interior of the etching unit 18 is set at a predetermined pressure.

In the etching unit 18, etching, using the downflow of the plasma gas comprised of $N_2$, $H_2$, and $NF_3$, is carried out. By this, the native oxide film ($SiO_2$ film), formed on the surface of the wafer W, is eliminated. Also, at the same time, on the dangling bond of the silicon (Si) of the surface of the wafer W, hydrogen (H) is bonded, and a stable film is formed.

After the etching processing, the interior of the etching unit 18 is set at a pressure almost the same as the conveyance room 16. Subsequently, the gate valve 24 is opened, and the wafer W is transferred out of the etching unit 18 by the second conveyance system 25.

The wafer W is subsequently sent to the oxidation processing unit 19. The second conveyance system 25 is mounted on the mounting table 52 in the interior of the oxidation processing unit 19. Then, the gate valve 24 is closed, and a predetermined pressure in the interior of the oxidation processing unit 19 is set.

The oxidation processing of a surface of a silicon substrate 101, is carried out by the RLSA-type plasma processing device in the oxide processing unit 19. By this, a silicon oxide of for example 1 nm to 20 nm is formed on the surface of the silicon substrate 101.

After the oxidation processing, the interior of the oxide processing unit 19 is set at almost the same pressure as the second conveyance room 16. Next, the second conveyance room 25 transfers in the wafer W to the interior of the etching unit. Then, the gate valve 24 is opened, and the wafer W is transferred out of the oxidation processing unit 19 by the second conveyance system 25. After the wafer W is transferred in, the gate valve 24 is closed, and the interior of the nitriding processing unit 20 is set at a predetermined pressure.

The nitriding processing of the surface of the silicon substrate 101 is carried out by the RLSA plasma processing device, in the nitriding processing unit 20. By this, the surface of the silicon oxide film is nitrided. By this, a part of the silicon oxide film, a silicon nitride film 107 of for example 0.5 nm to 6 nm is formed.

After the nitriding processing, the interior of the nitriding processing unit 20 is set at almost the same pressure as the second conveyance room 25. Then, the gate valve 24 is opened, and the wafer W is transferred out of the nitriding processing unit 20 by the second conveyance system 25. Next, the second conveyance system 25 transfers in the wafer W into the interior of the CVD unit 21. After the transferring in of the wafer W, the gate valve 24 is closed, and the interior of the CVD unit 21 is set at a predetermined pressure.

A high-permittivity film 108, for example a tantalum oxide film is formed on the silicon nitride film 107 by the CVD method in the CVD unit 21. The high-permittivity film 108 is formed at a thickness of for example 1 nm to 20 nm.

After the CVD processing, the interior of the CVD unit 21 is set at a predetermined pressure almost the same as the second conveyance room 16. Then, the gate valve 24 is opened, and wafer W is transferred out of the CVD unit 21 by the second conveyance system 25. Next, the second conveyance system 25 transfers in the wafer W into the interior of the annealing unit 22. After the transferring in of the wafer W, the gate valve 24 is closed, and the interior of the annealing unit 22 is set at a predetermined pressure.

Annealing processing applying the RLSA-type plasma processing device is performed to the wafer W, in the annealing unit 22. Namely, low-energy oxygen gas plasma is exposed to a high-permittivity film 108, and the carbon (C) in the film is eliminated.

After the annealing processing, the interior of the annealing unit 22 is set at about the same pressure as the second conveyance room 16. Then, the gate valve 24 is opened, and the wafer W is transferred out of the annealing unit 22 by the second conveyance system 25. Then, the second conveyance system 25 transfers in the wafer W into the load lock unit 17b. After the wafer W is transferred in, the gate valve 24 is closed, and the interior of the load lock unit 17b is set at almost the same pressure as the first reaction room.

Then, the first conveyance system 15 transfers out the wafer W from the load lock unit 17b, and accommodates them in the cassette C on the cassette mounting table 13. The forming process of a gate insulation film 104 comprising a silicon oxide 106, a silicon nitride film 107, and a high-permittivity film 108 is completed in the above-mentioned process.

The present invention is not limited to the aforementioned embodiments, and various modifications and applications are possible. The modifications which may be applied in the aforementioned embodiment of the present invention will be described below.

The structure of the etching unit 18 in the aforementioned embodiment, is only one example, and the structure may be of any kind as long as the structure can effectively eliminate the native oxide ($SiO_2$) formed on the surface of the wafer W. The structure of the CVD unit 21 is also only one example, and the structure may be of any kind as long as it is possible to form a tantalum oxide film on the SiN film. Furthermore, a structure fit for forming a high-permittivity film, besides the tantalum oxide, is possible.

In the aforementioned embodiment, an etching unit 18 is provided, and the native oxide film on the surface of the wafer W, is eliminated. However, instead of providing an etching unit 18, a structure which directly reforms a low quality silicon oxide film (native oxide film) to a high quality silicon oxide film 106, by the oxidation processing unit, is possible.

In the aforementioned embodiment, the oxide film forming processing, nitride film forming processing, and the annealing processing is carried out respectively in the oxidation processing unit 19, nitriding processing unit 20, and annealing unit 22. However, it may be carried out in the same unit, by for example integrating the gas supply units. Of course it is preferable that the processing is conducted in different units, from the viewpoint of throughput and safety.

In the aforementioned embodiment, the RLSA 62 and the waveguide 64, applied in the oxidation processing unit 19, nitriding processing unit 20, and annealing unit 22, is comprised of copper plate. Here, to control the conveyance loss of the microwave, the materials that comprise the RLSA 62 and the waveguide 64, may be high-permittivity Al, Cu, Ag/Cu coated stainless steel.

Also, the direction of the feed port to the circular waveguide 64, may be a direction wherein the microwave is supplied parallel to an H-plane such as an H-plane T-branch or in a direction parallel to a tangent, or a direction wherein the microwave is supplied vertically to an H-plane, such as an E-plane T-branch, as long as the microwave is effectively supplied into the microwave conveyance space, in the interior of the circular waveguide 64. Furthermore, ½ or ¼ of the wavelength in the tube, is the suitable slot interval of the wave direction of the microwave.

Furthermore, using a microwave of wavelength 2.45 GHz, a high-density plasma is generated. However, it is not limited to this, and the microwave frequency can be chosen accordingly, from the range of 0.8 GHz to 20 GHz.

The gas applied to oxidation and nitriding etc., is not limited to the aforementioned gas. For example instead of Ar, other noble gas such as Xe, Ne, Kr, and Hr may be applied. However, to control the damage to the film surface, and to effectively cut the bonding of the $SiO_2$, it is preferable to apply Ar.

When nitriding, nitrogen-containing gas such as $NH_3$, $N_2O$, NO, $NO_2$, may be applied besides $N_2$.

Moreover, the aforementioned mixed gas ratio of the mixed gas, is not limited to the aforementioned ratio (Ar/$N_2$/($O_2$)/$H_2$/=1:0:1:1), and for example, the abundance ratio of $N_2$ ($O_2$), $H_2$, may be changed respectively in a range from 0.05 to 5. Furthermore, reaction conditions concerning the wafer temperature, and reaction pressure etc., is not limited to the above-mentioned examples, and may be of any kind as long as a high-quality SiN film is formable.

In the aforementioned embodiment, the annealing unit 22 eliminates the carbon in the high-permittivity film using the RLSA-type plasma processing device, but a structure omitting the annealing unit 22 is possible. Of course, it is needless to say that a structure comprising an annealing unit 22 forms a more high-quality film.

In the aforementioned embodiment, the film in the bottom layer of the stacking gate insulator 104 is a silicon oxide film 106, but it may be a film containing silicon such as a silicon nitride film or a silicon oxide-nitride film. In this case, the kind of gas used in the oxidation processing unit 19 is changed. For example, if a silicon nitride (SiN) film is going to be formed, nitrogen gas is used instead of oxygen gas, and if a silicon oxide-nitride (SiON) film is going to be formed, it may be a structure further adding nitrogen gas.

INDUSTRIAL APPLICABILITY

In the aforementioned embodiment, an inorganic (metal) series as a high-permittivity film 108 was applied. However, other films comprised of SiC, SiN, etc., formed by CVD etc., may be used. In this case, the SiN film formed by the RLSA plasma functions as a film that prevents the penetration of impurities from the gate electrode (polycrystalline silicon) to the silicon substrate.

In the aforementioned mode, the gate electrode 105 of the MISFET 100, is comprised of polycrystalline silicon. However, it is not limited to this, and may be comprised of silicon-germanium.

In the aforementioned embodiment, the gate insulator 104 of the MISFET 100 is formed. However, it is not limited to this, and it is possible to apply the forming of the gate insulator in the present invention, to other devices such as a flash memory.

As described above, according to the present invention, a forming method and a forming system of a highly reliable gate insulator will be provided.

Various embodiments and changes may be made thereunto without departing from the broad spirit and scope of the invention. The above-described embodiment is intended to illustrate the present invention, not to limit the scope of the present invention. The scope of the present invention is shown by the attached claims rather than the embodiment. Various modifications made within the meaning of an equivalent of the claims of the invention and within the claims are to be regarded to be in the scope of the present invention.

This application is based on Japanese Patent Application No. 2001-260179 filed on Aug. 29, 2001 and including specification, claims, drawings and summary. The disclosure of the above Japanese Patent Application is incorporated herein by reference in its entirety.

What is claimed is:

1. A forming method of a gate insulator comprising:
    forming a silicon oxide film on a surface region of a silicon substrate;
    forming a silicon nitride film on a surface region of said silicon oxide film;
    forming a high-permittivity film with a higher permittivity than said silicon oxide film on said silicon nitride film,
    wherein,
    said silicon oxide film is formed on the surface region of said silicon substrate by exposing the surface of said silicon substrate to plasma generated by irradiating a gas containing oxygen with microwaves applied from a plane antenna having plural slits, and
    said silicon nitride film is formed on the surface region of said silicon oxide film by exposing the surface of said silicon oxide film to plasma generated by irradiating a gas containing nitrogen with microwaves applied from a plane antenna having plural slits.

2. The method according to claim 1, wherein said oxide film is formed by exposing an oxide film that has already been formed on said silicon substrate to said plasma containing said gas containing oxygen and reforming said already-formed oxide film.

3. The method according to claim 1, wherein said oxide film is formed by exposing the surface region of said silicon substrate to said plasma containing said gas containing oxygen and oxidizing the surface.

4. The method according to claim 1, wherein said nitride film is formed by exposing the surface region of said silicon oxide film to said plasma containing said gas containing nitrogen and nitriding the surface.

5. The method according to claim 1, wherein said high permittivity film is comprised of metal as the main component, and said high permittivity film is formed by exposing a surface of said high permittivity film to plasma generated by irradiating a gas containing oxygen with microwaves applied from a plane antenna having plural slits.

6. The method according to claim 5, further comprising a step of reforming said high permittivity film and eliminating carbon therefrom by exposing said high permittivity film to said plasma of said gas containing oxygen.

7. The method according to claim 1, wherein said silicon oxide film is formed at a thickness of 1nm~20nm, and said nitride film is formed at a thickness of 0.5nm~6nm.

8. The method according to claim 1, wherein said gas comprises argon.

9. The method according to claim 1, wherein said insulation film comprises a gate insulator of a MISFET.

* * * * *